United States Patent [19]

Ryu et al.

[11] Patent Number: 4,785,262

[45] Date of Patent: Nov. 15, 1988

[54] PULSE GENERATOR PRODUCING PULSES HAVING A WIDTH FREE FROM A POWER VOLTAGE AND A THRESHOLD VOLTAGE OF AN INVERTER USED THEREIN

[75] Inventors: Kazuo Ryu; Kyuichi Hareyama, both of Tokyo, Japan

[73] Assignee: NEC Corporation, Tokyo, Japan

[21] Appl. No.: 945,920

[22] Filed: Dec. 23, 1986

[30] Foreign Application Priority Data

Dec. 23, 1985 [JP] Japan .................. 60-291136

[51] Int. Cl.$^4$ .................. H03K 3/02; H03K 5/04
[52] U.S. Cl. .................. 331/111; 307/265; 307/268; 307/491; 331/52
[58] Field of Search ............. 307/265, 268, 271, 273, 307/260, 491, 363; 331/50, 52, 60, 108 B, 108 C, 113 R, 143, 144

[56] References Cited

U.S. PATENT DOCUMENTS

| | | | |
|---|---|---|---|
| 3,883,825 | 5/1975 | Cohen | 331/108 C |
| 4,122,413 | 10/1978 | Chen | 331/113 R |
| 4,255,722 | 3/1981 | Hochstrate | 331/113 R |
| 4,370,628 | 1/1983 | Henderson et al. | 331/113 R |

*Primary Examiner*—John Zazworsky

*Attorney, Agent, or Firm*—Sughrue, Mion, Zinn, Macpeak & Seas

[57] ABSTRACT

A pulse generator includes a capacitor having one end held at a reference potential and the other end, a first inverter having a threshold voltage and its input portion connected to the other end of the capacitor, a control circuit producing a signal for discharging the capacitor for a limited time period in response to an output from the first inverter, a switch for discharging the capacitor in response to the discharging signal, a resistor having a resistance, a current controller controlling the current flowing through the resistor to have a value obtained by dividing the threshold voltage by the resistance, and a means for supplying the current to the capacitor, output pulses being derived from input and/or output portion and/or internal portion of the control circuit. The control circuit may be a monostable multivibrator, a delay circuit or the like. The current controller may be formed of a transistor connected in series with the resistor and a second inverter having its input connected to the connecting point of the transistor and the resistor and its output connected the control electrode of the transistor, the second inverter having the same threshold voltage as the first inverter. The current supplying means may be a current-mirror.

14 Claims, 4 Drawing Sheets

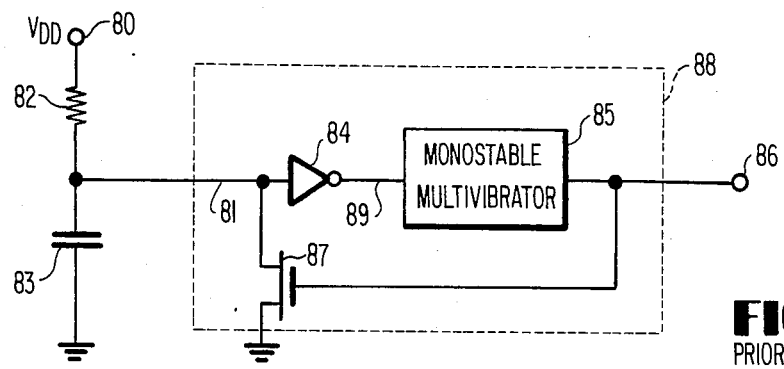
FIG 1
PRIOR ART
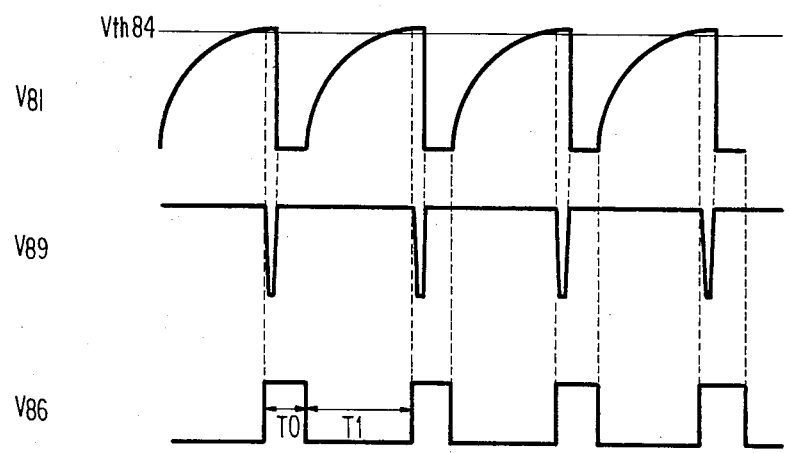
FIG 2
PRIOR ART
FIG 3
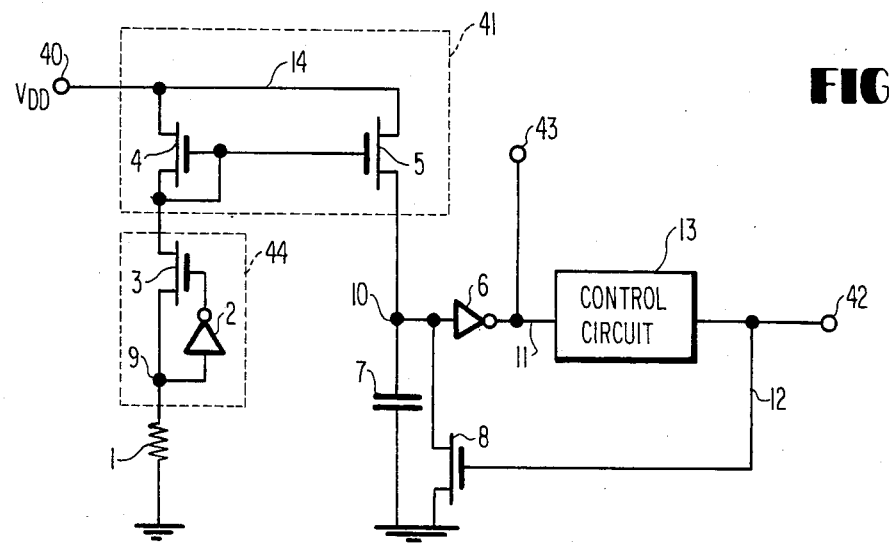

PULSE GENERATOR PRODUCING PULSES HAVING A WIDTH FREE FROM A POWER VOLTAGE AND A THRESHOLD VOLTAGE OF AN INVERTER USED THEREIN

BACKGROUND OF THE INVENTION

1. Field of the Invention:

This invention relates to a pulse generator producing pulses having a width free from a variation of power voltage and a threshold voltage of an inverter used therein.

2. Description of the Related Art Including Information Disclosed Under §1.97–1.99

Pulse generators in the prior art using a CR time constant circuit were widely employed in MOS integrated circuits. Such pulse generators has a series connection of a resistor and a capacitor supplied with a power voltage. An electrical path of source and drain of an MOS FET (MOS Field Effect Transistor) is connected in parallel with the capacitor. A cascade connection of an inverter and a monostable multivibrator is connected between a common connection point of the resistor, the capacitor and the drain of the MOS FET and the gate of the MOS FET.

The capacitor is charged through the resistor, when a voltage at the common connection point rises to the threshold voltage of the inverter, the inverter changes its output to trigger the monostable multivibrator. The multivibrator produces one control pulse by which the MOS FET turns on to discharge the capacitor. After the termination of the control pulse, the charging into the capacitor through the resistor resumes. In this way, the charging and discharging of the capacitor are repeated. Pulses are derived from the output of the monostable multivibrator. A repetition of the derived pulses is controlled by the time constant of the series connection of the resistor and the capacitor.

The repetition of the derived pulses will now be explained in more detail. One repetition cycle consists of a first period of the control pulse and a second period of the charging time. The signal levels at the first and second time periods are opposite to each other. The first time period is determined by the circuit construction of the monostable multivibrator. The second time period depends on the charging current into the capacitor and the threshold voltage of the inverter. The charging current changes by the power voltage. Therefore, the interval of the derived pulses, and more particularly the second time period, is affected from variations of the power voltage and the threshold voltage of the inverter.

As above-explained, the pulse generator in the prior art has a drawback which the interval of output pulses changes with a power voltage and a threshold voltage of an inverter used therein. The threshold voltage of an inverter is easily affected from an operating temperature and a manufacturing condition. Thus, the pulse generator in the prior art cannot produce a stable oscillation.

SUMMARY OF THE INVENTION

It is, therefore, a primary object of the present invention to provide a pulse generator using a CR time constant circuit and an inverter, the output pulses of which have constant time intervals free from a power voltage and a threshold voltage of the inverter.

A pulse generator according to the present invention comprises a capacitor having a first end held at a reference potential and a second end, a first inverter having a threshold voltage and having an input portion connected to the second end of the capacitor and an output portion producing an output, a control circuit having an input portion connected to the output portion of the inverter and an output portion producing a signal for discharging the capacitor for a limited time period in response to the output from the inverter, a switch coupled to the capacitor for discharging the capacitor in response to the discharging signal, a resistor having a resistance, a first means coupled to the resistor for producing a current having a value obtained by dividing the threshold voltage by the resistance, a second means for supplying the current to the capacitor, and a third means for deriving output pulses from the control circuit. More specifically, the first means includes a transistor having an electrical path of a common electrode and an output electrode connected in series with the resistor and a second inverter having the same threshold voltage as the first inverter and having an input portion connected to the connection point between the resistor and the electrical path of the common and output electrodes and an output portion connected to the control electrode of the transistor. The second means may be a current-mirror receiving the current flowing through the resistor and supplying the same current to the capacitor. The output pulses may be derived from the input and/or output portion of the control circuit.

In accordance with the present invention, the current having a value obtained by dividing the threshold voltage by the resistance is charged into the capacitor. When the voltage across the capacitor becomes the threshold voltage, the output of the first inverter changes to produce the discharging signal from the control circuit. The discharging signal closes the switch to discharge the capacitor. After the discharging signal, the charging into the capacitor resumes to repeat the above operation. The capacitor is charged by the current independent on the power voltage and dependent on the threshold voltage. Therefore, the time interval between successive discharging signals is determined by the time for charging the capacitor up to the threshold voltage irrespective of the threshold voltage, because the capacitor is charged by the threshold voltage dependent current. The time interval also does not depend on the power voltage, because the capacitor is charged by the power voltage free current. The time interval depends on only the resistance of the resistor and the capacitance of the capacitor. A stable operation free from a variation of the power voltage is obtained. The threshold voltage free interval means that the operation condition is not affected from a manufacturing condition.

BRIEF DESCRIPTION OF THE DRAWINGS

The above and further objects, features and advantages of the present invention will become more apparent from the following detailed description with reference to the drawings, wherein:

FIG. 1 is a brief circuit diagram of a pulse generator using a CR time constant circuit in the prior art;

FIG. 2 shows waveforms at some circuit points of the pulse generator shown in FIG. 1;

FIG. 3 is a brief circuit diagram showing a principle of a pulse generator of the present invention;

Figure 4:
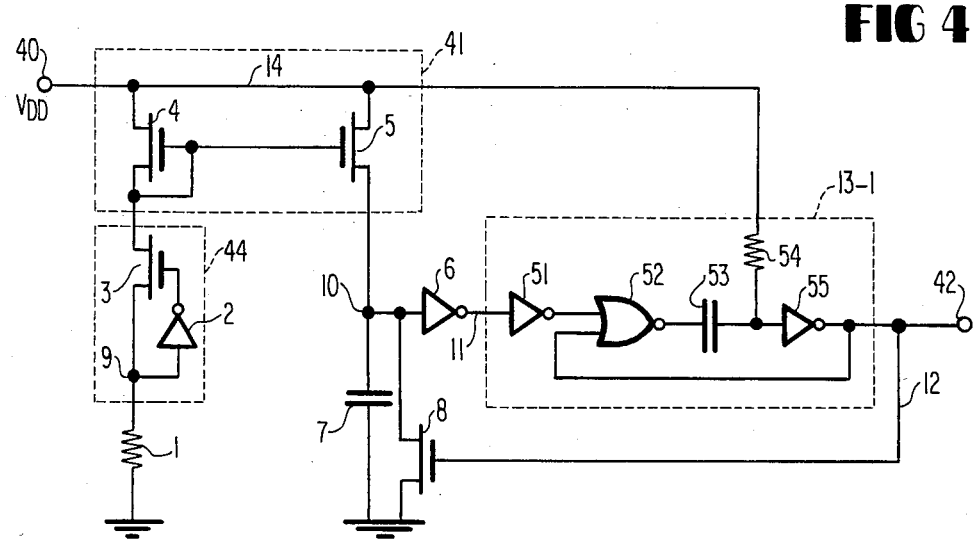
FIG. 4 is a first embodiment of the present invention.
Figure 5:
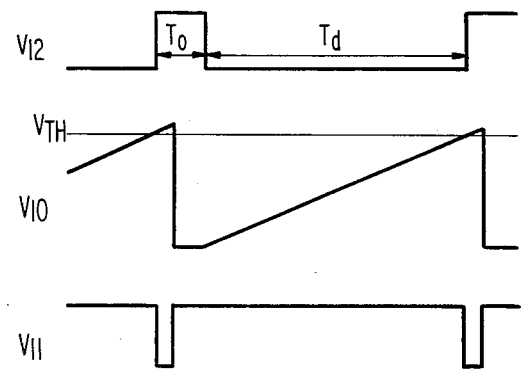
FIG. 5 shows waveforms at some circuit points of the pulse generator shown in FIG. 4.

A pulse generator in the prior art using a CR time constant circuit is consisted of a semiconductor integrated circuit 88 including an inverter 84, a monostable multivibrator 85 and a MOS FET 87 and an external circuit of a resistor 82 and a capacitor 83. An output pulse is derived from the monostable multivibrator 85 through an output terminal. The external series circuit of the resistor 82 and the capacitor 83 is connected between a power voltage terminal 80 having a power voltage $V_{DD}$ and a grounding point. The connection point between the resistor 82 and the capacitor 83 is connected through a circuit point 81 to the inverter 84 and a drain of the MOS FET 87. A source of the MOS FET is grounded. The output from the inverter 84 is applied to the monostable multivibrator 85 through a circuit point 89 to trigger the multivibrator 85. In response to the output from the inverter 84, one control pulse is produced by the multivibrator 85 and is applied to a gate of the MOS FET 87 to turn on. The conductive state of the MOS FET 87 discharges the capacitor 83.

The operation of the pulse generator in the prior art will now be explained with reference to the wave forms of FIG. 2. The capacitor 83 is charged through the resistor 82. When the voltage $V_{81}$ exceeds the threshold voltage $V_{TH}$ of the inverter 84, the output voltage $V_{81}$ of the inverter 84 drops to trigger the monostable multivibrator 85. The multivibrator 85 produces one control pulse having a pulse width $T_0$, as shown as a voltage $V_{86}$ at the output terminal 86. During the pulse width $T_0$, the MOS FET 87 turns on to discharge the capacitor 83. After the termination of the control pulse, the capacitor 83 is charged again through the resistor 82 to raise the voltage $V_{81}$. When the voltage $V_{81}$ reaches the threshold voltage $V_{TH}$, the output $V_{89}$ of the inverter 84 drops again to re-trigger the multivibrator 85. The charging time period $T_1$ to the capacitor depends on the resistance R of the resistor 82, the capacitance C of the capacitor 83, the power voltage $V_{DD}$ and the threshold voltage $V_{TH}$ as expressed in an equation (1);

$$T_1 = C \cdot R \ln \left(1 - \frac{V_{TH}}{V_{DD}}\right) \quad (1)$$

As apparent from the equation (1) and the waveform of the output voltage $V_{86}$, the charging period $T_1$ or an interval ($T_1$) between the control pulses ($T_0$) varies with the power voltage $V_{DD}$ and the threshold voltage $V_{TH}$ in addition to the resistance R and the capacitance C. Thus, a stable operation free from the variation of the power voltage $V_{DD}$ is not obtained. The operation is affected from a manufacturing condition which changes the threshold voltage $V_{TH}$. An extremely precise control of the manufacturing process is required.

DETAILED DESCRIPTION OF THE EMBODIMENTS

A principle circuit of the pulse generator according to the present invention is shown in FIG. 3. One end of a resistor 1 is grounded. A source of MOS FET 3 and an input of an inverter 2 are connected to the other end of the resistor 1, an output from the inverter 2 being applied to a gate of the MOS FET 3. Those inverter 2 and the MOS FET 3 form a current controller 44 which controls a current flowing through the resistor 1 to a value obtained by dividing a threshold voltage $V_{TH}$ of the inverter 2 by a resistance of the resistor 1. The current is applied to a current-mirror 41 which consists of MOS FET's 4 and 5, sources of the MOS FET's 4 and 5 being connected to a power terminal 40 through a power line 14 to receive a power voltage $V_{DD}$, and gates of the MOS FET's 4 and 5 being connected in common together with a drain of the MOS FET 4. The same current as the current flowing through the resistor 1 is charged into a capacitor 7 from a drain of the MOS FET 5 through a circuit point 10. A source-drain path of the MOS FET 8 is connected in parallel with the capacitor 7. The circuit point 10 is connected to an input of an inverter 6. When the charged voltage of the capacitor 7 reaches a threshold voltage $V_{TH}$ of the inverter 6 which is selected as the same value as the threshold voltage $V_{TH}$ of the inverter 2. An output from the inverter 6 is applied to a control circuit 13. The output from the control circuit 13 is applied to a gate of the MOS FET 8 through a path 12 to turn the FET 8 on and to discharge the capacitor 7. All the circuit elements except for only the resistor 1 or both of the resistor 1 and the capacitor 7 may be formed in a semiconductor integrated circuit.

One example of the control circuit 13 is a monostable multivibrator producing one pulse having a predetermined pulse width in response to the output from the inverter 6. This pulse is derived as an output pulse of the pulse generator from an output terminal 42. Another example of the control circuit 13 is a delay circuit which produces an output signal having a leading edge at a time after a predetermined time delay from the time when the charged voltage of the capacitor 7 reaches the threshold voltage $V_{TH}$ and having a trailing edge at a time when the capacitor 7 is discharged. In the latter example, output pulses having a width of the time delay are derived from an output terminal 43.

The current controller 44 controls the current $I_0$ following through the resistor 1 to a value of $V_{TH}/R$ (R being a resistance of the resistor 1). This constant current $I_0$ is charged into the capacitor 7 through the current-mirror 41. The time $T_d$ required to charge the capacitor 7 to the threshold voltage $V_{TH}$ can be expressed as follows;

$$T_d = \frac{C}{I_0} \cdot V_{TH} = \frac{C \cdot R}{V_{TH}} \cdot V_{TH} = C \cdot R \quad (2)$$

where C is a capacitance of the capacitor 7. This time $T_d$ is an interval between output pulses. It is noted that, in the later example, a negligibly short time is added to the time $T_d$ as the interval between output pulses. Anyway, the interval between output pulses is substantially determined by the equation (2).

To satisfy the equation (2), it is necessary that the threshold voltages of the inverters 2 and 6 are made equal. Those two inverters 2 and 6 are formed by the same circuit and the same elements. One example of such inverter is a C-MOS inverter in which source-drain paths of P- and N-channel MOS FET's are series connected between the power line 14 and the grounding point. Gates of both MOS FET's are commonly connected as an input, a common connection of drains being an output. When the channel lengths and the channel widths of both MOS FET's are respectively designed as 5 μm and 15 μm, the threshold voltage $V_{TH}$ becomes 1.5 volts.

If the resistance R of the resistor 1 is designed as 500 KΩ, the constant current $I_0$ flowing through the resistor 1 is 3 μA. Under this condition, if the capacitance C of the capacitor 7 is selected as 2 pF, the interval $T_d$ becomes 1 μsec. An example of the power voltage $V_{DD}$ is 5 volts. The capacitor 7 of 2 pF can be formed on a semiconductor chip together with other circuit elements except for the resistor 1.

As apparent from the equation (2), the pulse interval $T_d$ depends on neither the power voltage $V_{DD}$ nor the threshold voltage $V_{TH}$ but on the capacitance C and the resistance R only. This means that a constant interval of output pulses is obtained irrespectively of the power voltage, operation temperature and a manufacturing condition. Furthermore, if the output pulses have a very short pulse width compared to the interval $T_d$, a stable repetition frequency is obtained to use the pulse generator of the present invention as a clock generator in place of a clock generator using a crystal oscillator.

A first preferred embodiment according to the present invention shown in FIG. 4 uses a monostable multivibrator 13-1. A power voltage $V_{DD}$ of 5 volts is supplied to the power terminal 40. The monostable multivibrator 13-1 is formed of two inverters 51 and 55, a NOR gate 52, a resistor 54 and a capacitor 53. The inverter 51 receives the output from the inverter 6 for producing an output pulse from the multivibrator 13-1. One input of the NOR gate 52 receives an output from the inverter 51. The other input receives an output from the gate 55. An output from the NOR gate 52 is applied to the input of the inverter 55 through a capacitor 53. A resistor 54 is inserted between the power line 14 and the input of the inverter 55.

One pulse is produced from the inverter 55 in response to an output of low level from the inverter 6 and is derived as an output through the output terminal 42. The pulse width $T_0$ of the output pulse from the multivibrator is determined by the resistance $R_{54}$ of the resistor 54 and the capacitance $C_{53}$ of the capacitor 53 and is 20 nano-seconds as one example where the resistance $R_{54}$ and the capacitance $C_{53}$ are respectively 10 KΩ and 2 pF, that is $T_0 = 0.69\, R_{54} \cdot C_{53}$. The capacitor 53 of 2 pF can be also formed on a semiconductor chip together with other circuit elements other than the resistor 1.

Figure 6:
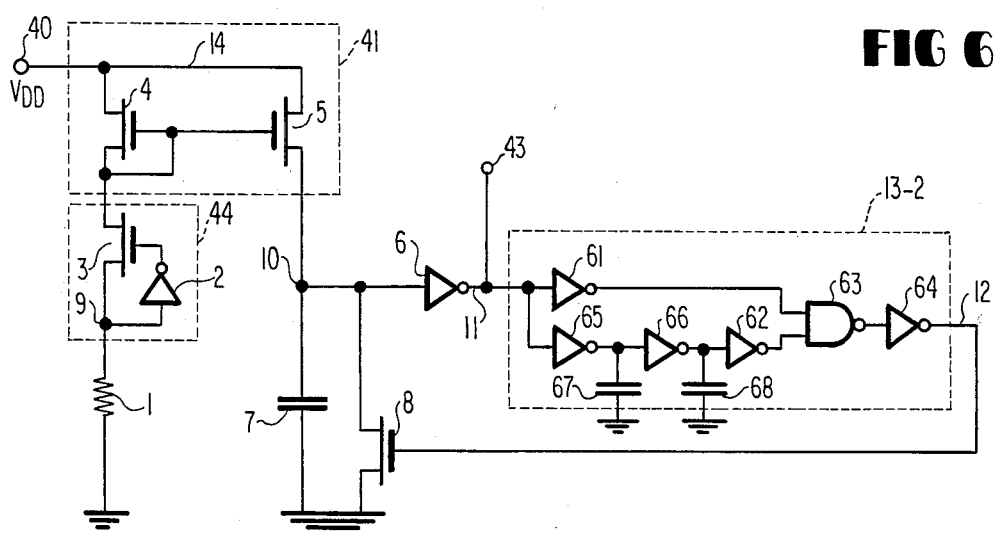
FIG. 6 is a circuit diagram of a second embodiment according to the present invention.

Waveforms ($V_{10}$, $V_{11}$ and $V_{12}$) at the circuit points 10 and 11 and the conductive path 12 are shown in FIG. 6. When the capacitor 7 is charged, the voltage $V_{10}$ at the circuit point 10 rises. If the voltage $V_{10}$ reaches the threshold voltage $V_{TH}$, the voltage $V_{11}$ at the output of the inverter 6 lowers to trigger the monostable multivibrator 13-1. The multivibrator produces one pulse having a pulse width $T_0$ on the voltage $V_{12}$ at the conductive path 12. During the term of the pulse width $T_0$, the capacitor 7 is discharged to hold the voltage $V_{10}$ at a low level. After the termination of the pulse, the capacitor 7 is re-charged to raise the voltage $V_{10}$. When the voltage $V_{10}$ becomes the threshold voltage $V_{TH}$ again, the charging into the capacitor 7 stops. The charging period is the interval $T_d$ of output pulses.

A second preferred embodiment according to the invention shown in FIG. 6 uses a delay circuit 13-2 which is formed by five inverters 61, 62, 64, 65 and 66, two capacitors 67 and 68 and a NAND gate 63. The output from the inverter 6 is applied to the inverters 61 and 65. While the output of the inverter 61 is directly applied to the NAND gate 63, the output of the inverter 65 is applied to the same NAND gate 63 through the inverters 66 and 62. At the interconnections between the inverters 65 and 66 and between the inverters 66 and 62, the capacitors 67 and 68 are respectively connected. In the signal path of the inverters 65, 66 and 62, electrical signal is delayed by the capacitors 67 and 68. In response to this delayed signal, the output of the NAND gate 63 lowers. The inverter 64 inverts the output of the NAND gate 63 to turn on the MOS FET 8. By the turning on, the capacitor 7 is discharged to change the output of the inverter 6 to a high level. Thus, the time period when the output of the inverter 6 keeps low level is determined by the delayed time by the electrical path of the inverters 65, 66 and 62 and the capacitors 67 and 68. The output from the inverter 6 is derived as an output of the pulse generator from the output terminal 43. When the output of the inverter 6 turns to a high level, the output of the NAND gate 63 is immediately raised by the nondelayed signal through the inverter 61 to lower the output of the inverter 64, the MOS FET 8 turning off to start charging into the capacitor 7. In practical use for digital processing, the capacitors 67 and 68 have a capacitance of several pF and can be formed on a semiconductor chip.

Figure 7:
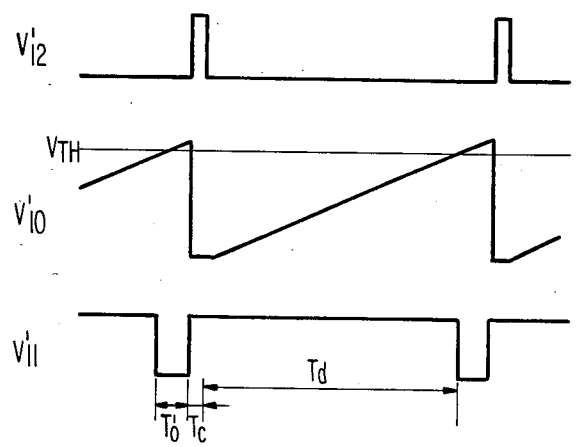
FIG. 7 shows waveforms at some circuit points of the pulse generator shown in FIG. 6.

The waveforms of the voltages $V'_{12}$ $V'_{10}$ and $V'_{11}$ at the conductive path 12 and the circuit points 10 and 11 obtained by the above-explained operation are shown in FIG. 7. After the voltage $V'_{10}$ reaches the threshold voltage $V_{TH}$, the voltage $V_{10}$ continues to rise for the delayed time $T_0'$ by the inverters 65, 66 and 62 and the capacitors 67 and 68. During this delayed time $T_0'$, the voltage $V'_{11}$ lowers to form an output pulse. After this delayed time $T_0'$, the voltage $V'_{12}$ rises to discharge the capacitor 7, resulted in a lowering of the voltage $V'_{10}$. When the capacitor 7 is discharged, the voltage $V'_{12}$ promptly rises to stop discharging and to start charging the capacitor 7. The discharging period $T_c$ is negligibly short. After the discharging period $T_c$, the capacitor is charged until the voltage $V'_{10}$ reaches the threshold voltage $V_{TH}$. This charging period is the interval $T_d$ explained with reference to FIG. 3.

Figure 8:
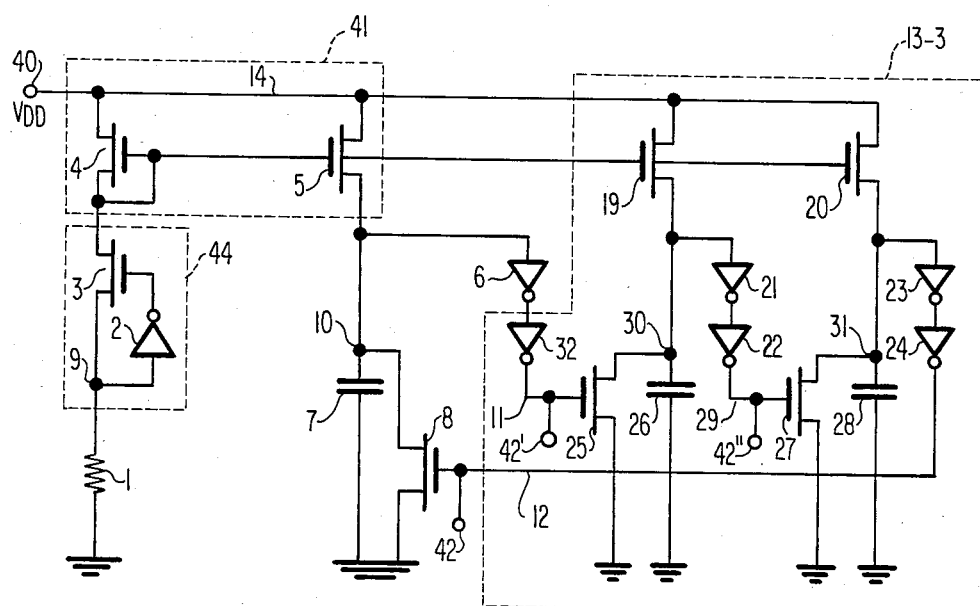
FIG. 8 is a circuit diagram of a third embodiment according to the present invention.
Figure 9:
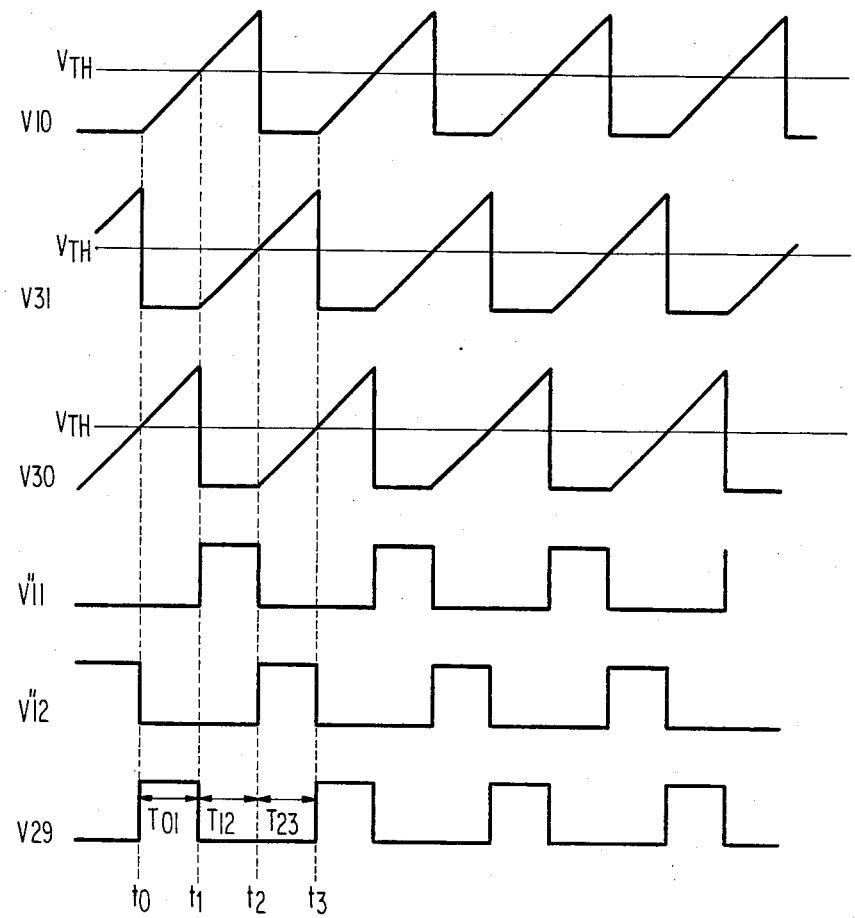
FIG. 9 shows wavefgrms at some circuit points of the pulse generator shown in FIG. 8.

A third preferred embodiment of the present invention shown in FIGS. 8 and 9 is a clock generator producing three phase clock pulses. The same currents as obtained at the drain of the MOS FET 5 of the current-mirror 41 flow from drains of the MOS FET's 19 and 20, respectively to charge capacitors 26 and 28 through circuit points 30 and 31. In other words, the MOS FET's 4, 5, 19 and 20 forms a current-mirror having three outputs which are currents having the same value as the current flowing through the resistor 1. Discharge from the capacitor 26 is controlled by turning on MOS FET 25 which is controlled by inverters 6 and 32. Similarly, discharge from the capacitors 28 and 7 are respectively controlled by turning on MOS FET's 27 and 8 which are respectively controlled by the inverters 21 and 22 and the inverters 23 and 24. Three pulses having different phases are derived from output terminals 42', 42″ and 42 connected to the gates of the MOS FET's 25, 27 and 8.

For obtaining three phase clock pulses having the same pulse width, the thresholds $V_{TH}$ of the inverters 2, 6, 21 and 23 are made equal, the capacitances C of the capacitors 7, 26 and 28 being made same and the currents from the drains of the MOS FEF's 5, 19 and 20 being also designed same. When the voltage $V_{10}$ at the circuit point 10 rises to the threshold voltage $V_{TH}$ at a time $t_1$, the output of the inverter 6 lowers and the output (the voltage $V''_{11}$) of the inverter 32 rises to turn on the MOS FET 25. The time period from a time $t_0$ when the charging into the capacitor 7 is started to the time $t_1$ when the voltage $V_{10}$ reaches the threshold voltage $V_{TH}$ is the interval $T_d$ explained with reference to FIG. 3 and equals C·R. During this interval $T_d$ from the time $t_0$ to the time $t_1$, the voltage $V'''_{11}$ is low and the voltage $V_{29}$ is high.

From the time $t_1$, the MOS FET 25 turns on by the high level output of the inverter 32, to discharge the capacitor 26. In accordance with the discharge of the capacitor 26, the $V_{30}$ lowers to a low level to change the outputs the inverters 21 and 22 to a high level and a low level. The low level output of the inverter 22 turns off the MOS FET 27 to start charging the capacitor 28. When the voltage $V_{31}$ reaches the threshold voltage $V_{TH}$ by charging the capacitor 28 at a time $t_2$, the outputs of the inverters 23 and 24 changes to a low level and a high level to turn on the MOS FET 8. By the turning on of the MOS FET 8, discharging of the capacitor 8 starts to lower the voltage $V'''_{10}$. During the period between the times $t_1$ and $t_2$, charging to the capacitor 10 continues to raise the voltage $V_{10}$. The outputs of the inverters 6 and 32 are a low level and a high level. At the time $t_2$, the output of the inverter 32 lowers by discharging the capacitor 7. Thus, a pulse is obtained on the voltage $V'_{11}$ at the output terminal 42′. The duration from the time $t_1$ to the time $t_2$ is the charging time of the capacitor 28. Therefore, the duration is same as the interver $T_d$ explained with reference to FIG. 3 and equals C·R.

The turning on the MOS FET 8 continues until the discharge of the capacitor 28 starts. The turning on of the MOS FET 8 lowers the voltage 10, changes the outputs of the inverters 6 and 32 to a high level and a low level and turns off the MOS FET 25 to start charging the capacitor 26. After the interval $T_d$, the voltage $V_{30}$ reaches the threshold voltage $V_{TH}$ at a time $t_3$ to change the outputs of the inverters 21 and 22 to a low level and a high level. At the time $t_3$, the MOS FET 27 turns on to start discharge the capacitor 28. Thus, during the period from the time $t_2$ and $t_3$, the voltage $V'''_{12}$ has a high level to produce another pulse having a pulse width of the interval $T_d$ at the output terminal 42.

As above-explained, a first pulse appears on the voltage $V_{29}$ at the output terminal 42″, a second pulse appearing on the voltage $V'''_{11}$ at the output terminal 42′ and a third pulse appearing on the voltage $V'''_{12}$ at the output terminal 42. These three pulses repeatedly appears on the voltages $V_{29}$, $V'''_{11}$ and $V'''_{12}$ and have the same pulse width of the interval $T_d$ explained with reference to FIG. 3. Because the interval $T_d$ depends on neither the power voltage $V_{DD}$ nor the threshold voltage $V_{TH}$ of the inverters 2, 6, 21 and 23 but on the resistance R of the resistor 1 and the capacitance C of the capacitors 7, 26 and 28, the pulse width and the repetition frequency of the three phase clock pulses are stable.

Examples of the resistance R of the resistor 1 and the capacitance C of the capacitors 7, 26 and 28 are respectively 500 KΩ and 2 pF. All the circuit elements other than the resistor 1 are formed on a single semiconductor chip as an integrated circuit. The capacitors 7, 26 and 28 may be externally connected to an integrated circuit.

Although some embodiments are explained hereinbefore, many modificationscan be made to the present invention. The resistor 1 and the current controller 44 may be inserted between the power line 14 and the capacitor 7 in FIGS. 4 and 6 to replace the current-mirror 41 with a mere wiring. In this modification, the inverter 2 in the current controller 44 must have such a threshold voltage $V_{TH2}$ that the value of $V_{DD}$ minus $V_{TH2}$ is equal to the value of the threshold voltage $V_{TH1}$ of the inverter 6. The monostable multibivrator 13-1 and the delay circuit 13-2 may be replaced with other circuit type of monostable multivibrator and delay circuit. In the third preferred embodiment, the number of cascaded stages of the transistors 19 (20) and 25 (27), the capacitor 26 (28) and the inverters 21 (23) and 22 (24) may be arbitrarily selected.

What is claimed is:

1. A pulse generator comprising:
   a first capacitor having a first end held at a reference potential and a second end;
   a first inverter having a threshold voltage and having an input portion connected to said second end of said first capacitor and an output portion producing an output when a voltage at said second end of said first capacitor exceeds said threshold voltage;
   a first means for producing a signal for discharging said first capacitor for a limited time period in response to said output from said first inverter;
   a first switch coupled to said first capacitor to discharge said first capacitor in response to said discharging signal from said first means;
   a resistor having a resistance;
   a second means coupled to said resistor for controlling a current flowing through said resistor to have a value obtained by dividing said threshold voltage by said resistance;
   a third means for supplying said current to said first capacitor; and
   a fourth means for deriving output pulses from said first means.

2. A pulse generator as claimed in claim 1, wherein said second means includes a transistor having an electrical path of a common electrode and an output electrode connected in series with said resistor and having a control electrode, and a second inverter having an input portion connected to the connecting point of said transistor and said resistor and having an output portion connected to said control electrode of said transistor.

3. A pulse generator as claimed in claim 2, wherein said third means is a current-mirror receiving said current from the series connection of said transistor and said resistor and supplying a charging current having the same value as said current to said capacitor, said second inverter having a threshold voltage having the same value as said threshold voltage.

4. A pulse generator as claimed in claim 3, wherein said first means is a circuit for producing one pulse as said discharging signal at an output portion in response to said output from said first inverter.

5. A pulse generator as claimed in claim 4, wherein said fourth means derives said output pulses from said output portion of said one pulse producing circuit.

6. A pulse generator as claimed in claim 5, wherein said one pulse producing circuit is a monostable multivibrator.

7. A pulse generator as claimed in claim 3, wherein said first means is a delay circuit having an input and an output portion and producing said discharging signal from said output portion in response to said output from said first inverter applied to said input portion after a predetermined time, said discharging signal being terminated when said output from said first inverter disappears.

8. A pulse generator as claimed in claim 7, wherein said fourth means derives said output pulses from said input portion of said delay circuit.

9. A pulse generator as claimed in claim 3, wherein said first means includes a second capacitor having a first end held at said reference potential and a second end, a third capacitor having a first end held at said reference potential and a second end, a fifth means for supplying said current to said second capacitor through said second end thereof, a sixth means for supplying said current to said third capacitor through said second end thereof, a third inverter receiving said output from said first inverter, a second switch coupled to said second capacitor to discharge said second capacitor in response to an output from said third inverter, a fourth inverter having said threshold voltage and having an input portion connected said second end of said second capacitor, a fifth inverter receiving an output from said fourth inverter, a third switch coupled to said third capacitor to discharge said third capacitor in response to an output from said fifth inverter, a sixth inverter having said threshold voltage and having an input portion connected to said second end of said third capacitor, and a seventh inverter receiving an output from said sixth inverter, an output from said seventh inverter being applied to said first switch as said discharging signal and said first, second and third capacitor having the same capacitance.

10. A pulse generator as claimed in claim 9, wherein said fourth means derives said outputs from said third, fifth and seventh inverters as three of said output pulses.

11. A pulse generator as claimed in claim 3, wherein said first means includes an output portion for outputting said discharging signal a third inverter receiving said output from said first inverter and having an output portion and a pluraltiy of stages connected in cascade between said output portions of said third inverter and said first means, each of said stages including:
an input terminal;
an output terminal;
a second capacitor having a first end held at reference potential and a second end;

sixth means for supplying said current to said second capacitor;
a second switch connected in parallel with said second capacitor, said second switch turning on to discharge said second capacitor in response to a signal applied to said input terminal;
a fourth inverter having said threshold voltage and having an input portion connected to said second end of said second capacitor and an output portion; and
a fifth inverter having an input portion connected to said output portion of said fourth inverter and an output portion connected to said output terminal.

12. A pulse generator as claimed in claim 11, wherein said fourth means derives said output pulses from said output portions of said third and fifth inverters.

13. A pulse generator as claimed in claim 12, wherein the number of said stages is two.

14. A pulse generator comprising:
a power supplying line held at a power voltage;
a reference potential line held at a reference potential;
a capacitor having a first end connected to said reference potential line and a second end;
a first inverter having a threshold voltage and having an input portion connected to said second end of said capacitor and an output portion producing an output when a voltage at said second end of said capacitor exceeds said threshold voltage;
a first means for producing a signal for discharging said capacitor for a limited time period in response to said output from said first inverter;
a first switch coupled to said capacitor to discharge said capacitor in response to said discharging signal from said first means;
a resistor having a resistance and having a first end connected to said power supplying line and a second end;
a second means including a transistor having a common electrode, an output electrode and a control electrode, and electrical path between said common and output electrodes being connected between said second end of said resistor and said second end of said capacitor, and a second inverter having an input portion connected to said second end of said resistor and an output portion connected to said control electrode of said transistor, an absolute value of a threshold voltage of said second inverter as measured from said power voltage being substantially equal to a value of said threshold voltage of said first inverter; and a third means for deriving output pulses from said first means.

* * * * *

UNITED STATES PATENT AND TRADEMARK OFFICE
CERTIFICATE OF CORRECTION

PATENT NO. : 4,785,262

DATED : November 15, 1988

INVENTOR(S) : KAZUO RYU ET AL, Tokyo, Japan

It is certified that error appears in the above-identified patent and that said Letters Patent is hereby corrected as shown below:

Column 7, line 7, delete "MOSFEF's" and insert --MOS FET's--.

Column 8, line 8, delete "modificationscan" and insert --modifications can--.

Signed and Sealed this

Eighth Day of August, 1989

Attest:

DONALD J. QUIGG

*Attesting Officer*     *Commissioner of Patents and Trademarks*